US008928319B2

(12) United States Patent
Feiweier

(10) Patent No.: US 8,928,319 B2
(45) Date of Patent: Jan. 6, 2015

(54) MAGNETIC RESONANCE METHOD AND APPARATUS TO CORRECT IMAGE DISTORTIONS IN DIFFUSION-WEIGHTED IMAGING

(75) Inventor: Thorsten Feiweier, Poxdorf (DE)

(73) Assignee: Siemens Aktiengesellschaft, Munich (DE)

( * ) Notice: Subject to any disclaimer, the term of this patent is extended or adjusted under 35 U.S.C. 154(b) by 812 days.

(21) Appl. No.: 13/157,503

(22) Filed: Jun. 10, 2011

(65) Prior Publication Data
US 2011/0304334 A1 Dec. 15, 2011

(30) Foreign Application Priority Data
Jun. 10, 2010 (DE) .......................... 10 2010 029 932

(51) Int. Cl.
*G01R 33/565* (2006.01)
*G01R 33/563* (2006.01)

(52) U.S. Cl.
CPC .... G01R 33/56341 (2013.01); G01R 33/56518 (2013.01)
USPC ........... 324/314; 324/306; 324/307; 324/309; 324/322

(58) Field of Classification Search
USPC .......................... 324/300–322; 600/407–435; 382/128–131
See application file for complete search history.

(56) References Cited

U.S. PATENT DOCUMENTS

| 6,463,315 | B1 * | 10/2002 | Klingberg et al. | 600/410 |
|---|---|---|---|---|
| 6,815,952 | B1 * | 11/2004 | Rose et al. | 324/307 |
| 6,842,000 | B2 * | 1/2005 | Norris et al. | 324/309 |
| 6,891,373 | B2 * | 5/2005 | Deimling | 324/309 |
| 7,205,763 | B2 * | 4/2007 | Porter | 324/306 |
| 8,283,925 | B2 * | 10/2012 | Auslender et al. | 324/309 |
| 8,436,613 | B2 * | 5/2013 | Feiweier | 324/309 |
| 8,487,617 | B2 * | 7/2013 | Feiweier et al. | 324/314 |
| 8,508,226 | B2 * | 8/2013 | Feiweier et al. | 324/309 |
| 8,565,854 | B2 * | 10/2013 | Bryskhe et al. | 600/410 |
| 8,638,098 | B2 * | 1/2014 | Feiweier | 324/309 |
| 8,666,475 | B2 * | 3/2014 | Hirsch | 600/411 |
| 2004/0071324 | A1 * | 4/2004 | Norris et al. | 382/128 |
| 2004/0140803 | A1 * | 7/2004 | Deimling | 324/309 |
| 2004/0227510 | A1 * | 11/2004 | Rose et al. | 324/309 |
| 2005/0237057 | A1 * | 10/2005 | Porter | 324/307 |

(Continued)

OTHER PUBLICATIONS

T.G.Reese et al.; Reduction of Eddy-Current-Induced Distortion in Diffusion MRI Using a Twice-Refocused Spin Echo; Magnetic Resonance in Medicine vol. 49, 2003, pp. 177-182; 49.

(Continued)

*Primary Examiner* — Melissa Koval
*Assistant Examiner* — Tiffany Fetzner
(74) *Attorney, Agent, or Firm* — Steven H. Noll

(57) ABSTRACT

In a magnetic resonance (MR) apparatus and an operating method for the apparatus, image distortions are corrected that occur in exposures of diffusion-weighted MR images of an examination subject.
A diffusion-weighted image is acquired using a first acquisition process.
Another diffusion-weighted reference image is acquired using a second acquisition process that is different than the first acquisition process.
The second acquisition process causes significantly smaller eddy current-dependent image distortions than the first acquisition process given the same b-value.
Correction parameters to correct the image distortions of the diffusion-weighted image are determined by comparing the diffusion-weighted image with the reference image in order to determine the correction parameters such that the diffusion-weighted image can be converted into the reference image with the aid of the correction parameters.

14 Claims, 2 Drawing Sheets

(56) References Cited

U.S. PATENT DOCUMENTS

| | | | | |
|---|---|---|---|---|
| 2007/0052417 | A1 | 3/2007 | Zhang et al. | 324/309 |
| 2008/0275329 | A1 | 11/2008 | Reeder et al. | 600/410 |
| 2010/0171498 | A1* | 7/2010 | Auslender et al. | 324/309 |
| 2010/0277169 | A1* | 11/2010 | Feiweier | 324/307 |
| 2011/0052031 | A1 | 3/2011 | Feiweier | 382/131 |
| 2011/0187367 | A1* | 8/2011 | Feiweier et al. | 324/309 |
| 2011/0241679 | A1* | 10/2011 | Feiweier et al. | 324/309 |
| 2011/0304334 | A1* | 12/2011 | Feiweier | 324/314 |
| 2012/0068702 | A1* | 3/2012 | Feiweier | 324/309 |
| 2012/0143041 | A1* | 6/2012 | Hirsch | 600/411 |
| 2012/0280686 | A1* | 11/2012 | White et al. | 324/309 |
| 2013/0063144 | A1* | 3/2013 | Feiweier | 324/309 |

OTHER PUBLICATIONS

Nils Bodammer et al., "Eddy Current Correction in Diffusion-Weighted Imaging Using Pairs of Images Acquired With Opposite Diffusion Gradient Polarity", Magnetic Resonance in Medicine, vol. 51, pp. 188-193 (2004).

John C. Haselgrove, et al., "Correction for Distortion of Echo-Planar Images Used to Calculate the Apparent Diffusion", Magnetic Resonance in Medicine, vol. 36, pp. 960-964 (1996).

0. Heid: "Eddy Current-Nulled Diffusion Weighting", Proc. Intl. Soc. Mag. Reson. Med. 8 (2000), p. 799.

J. Finsterbusch: "Double-spin-echo diffusion weighting with a modified eddy current adjustment", Mag. reson. Imaging 28 (2010), pp. 434-440.

J. Finsterbusch: "Eddy-current compensated diffusion weighting with a single refocusing RF pulse", Magn. Reson. Med. 61 (2009), pp. 748-754.

M. Koch et al: "An assessment of eddy current sensitivity and correction in single-shot diffusion-weighted imaging", Phys. Med. Biol. 45 (2000), pp. 3821-3832.

* cited by examiner

MAGNETIC RESONANCE METHOD AND APPARATUS TO CORRECT IMAGE DISTORTIONS IN DIFFUSION-WEIGHTED IMAGING

BACKGROUND OF THE INVENTION

1. Field of the Invention

The present invention concerns a method to correct distortions in diffusion-weighted MR images, and a non-transitory, computer-readable data storage medium designed to implement such a method.

2. Description of the Prior Art

In diffusion-weighted EPI imaging ("echoplanar imaging"), distortions that are generated by unwanted eddy currents in gradient coils present a large challenge or problem. The high gradient amplitudes used to switch (activate) diffusion gradients encounter a high sensitivity (approximately 10 Hz per pixel in the phase coding direction is typical in EPI) with regard to static and dynamic field disruptions.

In diffusion imaging, multiple MR images with respective different diffusion directions and diffusion weightings, which are characterized by what is known as the b-value, are normally acquired and combined with one another in order to create parameter maps from these, for example. The parameter maps contain information about the ADC ("Apparent Diffusion Coefficient") and the FA ("Fractional Anisotropy").

Diffusion imaging and the information derived therefrom can be used for diagnostic purposes. However, it must be taken into account that the eddy current fields generated by the diffusion gradients lead to distortions in the MR images depicting the diffusion. The appearance of these image distortions depends on both the amplitude of the gradients (i.e. on the diffusion weighting or the b-value) and on their direction (i.e. the diffusion direction, thus the direction in which the diffusion is detected). If the acquired individual MR images are combined with one another without correction, the various distortions for the respective MR image lead to incorrect associations of pixel information, and therefore to corresponding errors, or at least to a reduced precision of the derived or calculated parameters.

According to the prior art (see for example "Correction for Distortion of Echo-Planar Images Used to Calculate the Apparent Diffusion Coefficient", J. C. Haselgrove et al., MRM 36: 960-964 (1996)), a reference image that is suitable as a reference due to negligible eddy current-dependent distortions is generated with a relatively small b-value (for example b=0 to 200 s/mm2). However, the contrast of the reference image deviates relatively strongly from the contrast of the diffusion-weighted MR images to be corrected. For example, the signal of the cerebrospinal fluid (liquor) is brightly visible in the reference images but is nearly at the level of the background noise in the distorted diffusion-weighted MR images. An affine registration of such images therefore frequently leads to an incorrect scaling in that the distorted MR images are enlarged such that the outer contour of these MR images (which is defined by the grey brain matter) is mapped to the outer contour of the reference images (which is defined by the cerebrospinal fluid).

Moreover, according to the prior art (see for example "Eddy Current Correction in Diffusion-Weighted Imaging Using Pairs of Images Acquired With Opposite Diffusion Gradient Polarity", N. Bodhammer et al., Magnetic Resonance in Medicine 51: 188-193 (2004)) it is known to register two inversely distorted images. This method avoids the weakness of the method according to the prior art that is described above in that two images with identical contrast but inverted distortion (due to the inversion of the gradient direction) are registered with one another. However, for this purpose at least two images must be acquired for each diffusion direction and diffusion weighting. Moreover, according to this method two relatively strongly diffusion-weighted MR images with a low signal-to-noise ratio are registered to one another, which disadvantageously affects the stability of the method.

SUMMARY OF THE INVENTION

An object of the present invention is to eliminate the eddy current-dependent distortions from the diffusion-weighted MR images, and thereby to optimally avoid the problems known according to the prior art.

In accordance with the present invention, a method is provided to correct image distortions which occur in the acquisition of diffusion-weighted MR images of an examination subject that includes following steps:

Acquire a diffusion-weighted image of the examination subject by means of a first acquisition process.

Acquire a diffusion-weighted reference image of the examination subject by means of a second acquisition process, wherein this second acquisition process differs from the first acquisition process.

Determine correction parameters in order to correct image distortions within the diffusion-weighted image with these correction parameters.

These correction parameters are determined in that the diffusion-weighted image is compared with the reference image. The correction parameters are determined such that the diffusion-weighted image can be transferred, or made transferrable, into the reference image with the use of these correction parameters. The second acquisition process causes significantly smaller eddy current-dependent image distortions than the first acquisition process when both acquisition processes operate with the same b-value, such that the reference image has nearly no eddy current-dependent image distortions.

As used herein an "acquisition process" means an imaging sequence formed of RF pulses and diffusion gradients. Two acquisition processes are different when the respective imaging sequences have qualitative differences, for example with regard to the number or direction of their RF pulses. In contrast to this, two acquisition processes are not different if the respective imaging sequences have only quantitative differences, for example with regard to the amplitude or duration of the diffusion gradients.

The method according to the invention is an image-based registration method with which the diffusion-weighted image is registered (compared) relative to or with the reference image and, due to the second acquisition process, operates with a reference image that has at most small eddy current-dependent image distortions but nevertheless can show a contrast similar to the diffusion-weighted image; so that when the correction of such distortions takes place, the diagnostic content, i.e. the contrast, of the diffusion weighted image is preserved and/or maintained.

For example, geometric correction parameters can be determined by a comparison between the distorted diffusion-weighted MR image and the reference image on the basis of a measure of similarity (for example the cross-correlation or NMI ("Normalized Mutual Information")).

In comparison to methods according to the prior art, due to the low contrast differences between the reference image and the diffusion-weighted image, the method according to the invention has a shorter acquisition time and has a high precision in the registration. Overall the present invention leads to a marked improvement of the robustness and precision in the image-based correction of eddy current-dependent distortions in echoplanar diffusion imaging.

According to a preferred embodiment according to the invention, the second acquisition process to create the reference image operates with a second refocusing spin echo sequence. A first bipolar field gradient or diffusion gradient is thereby switched with a first time period and a second time period, and subsequently a second bipolar field gradient or diffusion gradient is switched with a third time period and a fourth time period. A first refocusing RF pulse is located between the first time period and the second time period and a second refocusing RF pulse is located between the third time period and the fourth time period. An RF pulse is switched for excitation before the first bipolar field gradient.

One example of such a spin echo sequence refocused twice is shown in FIG. 1 of "Reduction of Eddy-Current-Induced Distortion in Diffusion MRI Using a Twice-Refocused Spin Echo", T. R. Reese, O. Heid et al., Magnetic Resonance in Medicine 49: 177-182 (2003).

While the second acquisition process advantageously operates with a bipolar diffusion coding, the first acquisition process preferably uses a monopolar diffusion coding, for example the Stejskal-Tanner technique.

A monopolar diffusion coding typically leads to relatively strong, eddy current-dependent image distortions. However, acquisition methods with a monopolar diffusion coding for the diagnosis are desired or even necessary in many cases in order to generate images with a sufficiently high signal-to-noise ratio in a shorter amount of time, for example.

The distortions in the reference image can be effectively reduced with the double spin echo method with bipolar diffusion gradients or, respectively, twice-refocused spin echo sequence (see above). However, according to the invention these methods are not used to generate the diffusion-weighted MR images (thus as a first acquisition process) since they have a lower signal-to-noise ratio and an increased SAR ("Specific Absorption Rate") in comparison to the Stejskal-Tanner technique, for example.

According to an additional embodiment according to the invention, the following relationships apply for the $b_1$ value that corresponds to the b-value of the first acquisition process and for the $b_2$ value that corresponds to the b-value of the second acquisition process:

$$b_1 > b_2 \quad (1)$$

$$b_1 < 2*b_2 \quad (2)$$

$$b_2 < 500 \text{ s/mm2} \quad (3)$$

For example, according to these relationships (1) through (3) a b-value of the second acquisition process ($b_2$ value) of somewhat more than 500 s/mm² would be suitable for a b-value of the first acquisition process ($b_1$ value) of 1000 s/mm².

Moreover, it is possible to repeatedly implement the measurement or acquisition of the reference image and to correspondingly add the resulting data in order to improve the signal-to-noise ratio of the reference image.

The signal-to-noise ratio of the reference image can be increased to an acceptable level even if the selected reference b-value (i.e. the b-value of the second acquisition process) is relatively large (the signal-to-noise ratio decreases with increasing b-value).

By definition, an MR image that is acquired with a b-value of 0 s/mm² has no eddy current-dependent distortions and therefore does not need to be registered or distortion-corrected.

According to an additional embodiment according to the invention, multiple reference measurements (i.e. acquisitions of a reference image) are conducted, wherein these reference measurements are operated with the same diffusion weighting but different diffusion directions. Due to the respective different diffusion directions, the reference image composed of the various reference measurements can be generated nearly isotropically.

If the diffusion-weighted images plagued with distortions are acquired with different b-values, it is advantageous if reference images likewise exist which have likewise been acquired with correspondingly different b-values. To correct the image distortions of the respective diffusion-weighted image, that reference image whose contrast is most similar to the contrast of the respective diffusion-weighted MR image can then be selected from these multiple reference images; so that when the correction of such distortions takes place, the diagnostic content, i.e. the contrast, of the diffusion weighted image is preserved and/or maintained.

According to the invention, it is possible for the same reference image to be used for multiple diffusion-weighted images, wherein these multiple diffusion-weighted images have been acquired with regard to respective different diffusion directions.

The reference image can be acquired with a diffusion coding for a diffusion direction, wherein this diffusion direction corresponds to the direction of a gradient axis in which eddy current fields occur to a lesser degree than in other gradient axes.

The diffusion direction plays only a subordinate role in the acquisition of a reference image and therefore can be freely selected. The direction can therefore be selected such that a gradient axis which is known to have only small eddy current fields is used for the diffusion coding.

Moreover, the diffusion direction (and therefore the diffusion coding) of the reference image can also be selected such that multiple physical gradient axes can be used simultaneously. This offers the advantage that the gradient moment necessary for the diffusion coding can be built up in a very short time.

Since the b-value of the reference images (i.e. the b-value of the second acquisition process) is generally smaller than the b-value of the first acquisition process to acquire the diffusion-weighted images, the acquisition time of the reference image corresponds to the acquisition time of a diffusion-weighted image. Therefore, new reference images can be acquired—even inserted into the actual measurement workflow (in which the diffusion-weighted images are acquired)—without decisively influencing the sequence workflow.

The acquisition of a new reference image has nearly no effect on the steady [equilibrium] state of the magnetization which forms during the acquisition of the diffusion-weighted images, such that no additional time loss arises beyond the acquisition time for the reference image.

Moreover, the method according to the invention can be combined with an adjustment technology.

Within the scope of the present invention, a magnetic resonance system is also provided to acquire diffusion-weighted images. The magnetic resonance system has an activation unit to activate a tomograph i.e., scanner (MR data acquisition unit) of the magnetic resonance system; a receiver device to receive signals acquired by the tomograph; and an evaluation device to evaluate the signals, to create the diffusion-weighted MR images and to correct the image distortions. The magnetic resonance system acquires a diffusion-weighted image with a first acquisition process and a reference image with a second acquisition process, wherein the first acquisition process differs from the second acquisition process. The evaluation device compares the diffusion-weighted image with the reference image in order to thereby determine correction parameters to correct image distortions of the diffusion-weighted image. The evaluation device thereby determines the correction parameters such that the evaluation device can transform the diffusion-weighted image into the reference image by means of the correction parameters. Given the same b-value as the first acquisition process, the second acquisition process thereby generates significantly smaller eddy current-dependent distortions in comparison to the first acquisition process, such that the reference image has nearly no eddy current-dependent image distortions.

The advantages of the magnetic resonance system according to the invention essentially correspond to the advantages of the method according to the invention which have been described in detail in the preceding.

The present invention also encompasses an electronically readable data storage medium (for example a DVD, a magnetic tape or a USB stick) on which is stored electronically readable control information, in particular software. All embodiments of the method described in the preceding can be implemented when this control information (software) is read from the data medium and stored in a controller or, respectively, computer of a magnetic resonance system.

The software forms a computer program product that can be loaded into a memory of a programmable controller or a computer of a magnetic resonance system. All or some embodiments of the method according to the invention that are described in the preceding can be executed with this computer program product when the computer program product runs in the controller. The computer program product may require program means (for example libraries and auxiliary functions) in order to realize the corresponding embodiments of the method. The software can be a source code (for example C++) that must still be compiled (translated) and linked or must only be interpreted, or can be an executable software code that has only to be loaded into the corresponding computer for execution.

The present invention is suitable to generate diffusion-weighted MR images which have only small eddy current-dependent distortions. Naturally, the present invention is not limited to this preferred field of application.

DESCRIPTION OF THE PREFERRED EMBODIMENTS

Figure 1:
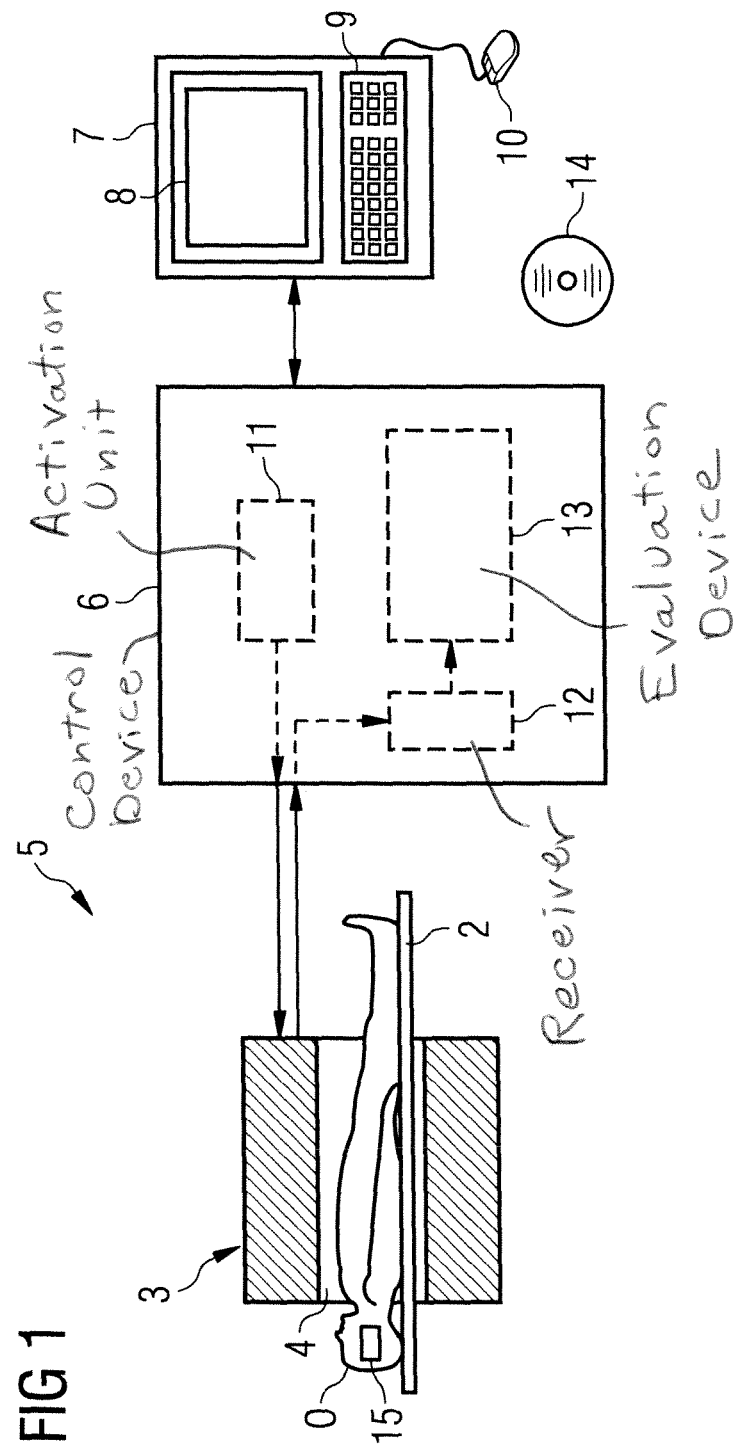
FIG. 1 schematically illustrates a magnetic resonance system according to the invention.

A magnetic resonance system 5 according to the invention is schematically shown in FIG. 1. The magnetic resonance system 5 has essentially a scanner 3 with which the magnetic fields necessary for the MR examination are generated in a measurement space 4; a table or recumbent board 2; a control device 6 with which the scanner 3 is operated and MR data are acquired by the scanner 3; and a terminal 7 connected to the control device 6.

The control device 6 for its part comprises an activation unit 11, a receiver device 12 and an evaluation device 13. During the creation of an image data set, MR data are collected by the receiver device 12 by means of the scanner 3, wherein the scanner 3 and the table 2 are activated by the activation unit 11 such that MR data are acquired in a measurement volume 15 which is located inside the body of a patient O situated on the table 2.

The evaluation device 13 then provides the MR data such that they can be graphically presented on a monitor 8 of the terminal 7, and such that diffusion-weighted MR images created according to the invention are displayed in which eddy current-dependent distortions are eliminated. In addition to the graphical presentation of the MR data, with the terminal 7 (that includes a keyboard 9 and a mouse 10 in addition to the monitor 8) the diffusion direction and the b-value (for example) for both acquisition of the reference image and acquisition of the diffusion-weighted MR images can be predetermined by a user, and additional parameters can be defined to implement the method according to the invention. The software for the control device 6 can also be loaded into the control device 6 via the terminal 7. This software of the control device 6 can thereby also comprise the method according to the invention. It is thereby also possible that a method according to the invention is contained in a software that runs in the terminal 7. Independent of in which software the method according to the invention is contained, the software can be stored on a DVD 14 so that this software can then be read by the terminal 7 from the DVD and be copied either into the control device 6 or into a computer of the terminal 7 itself.

Figure 2:
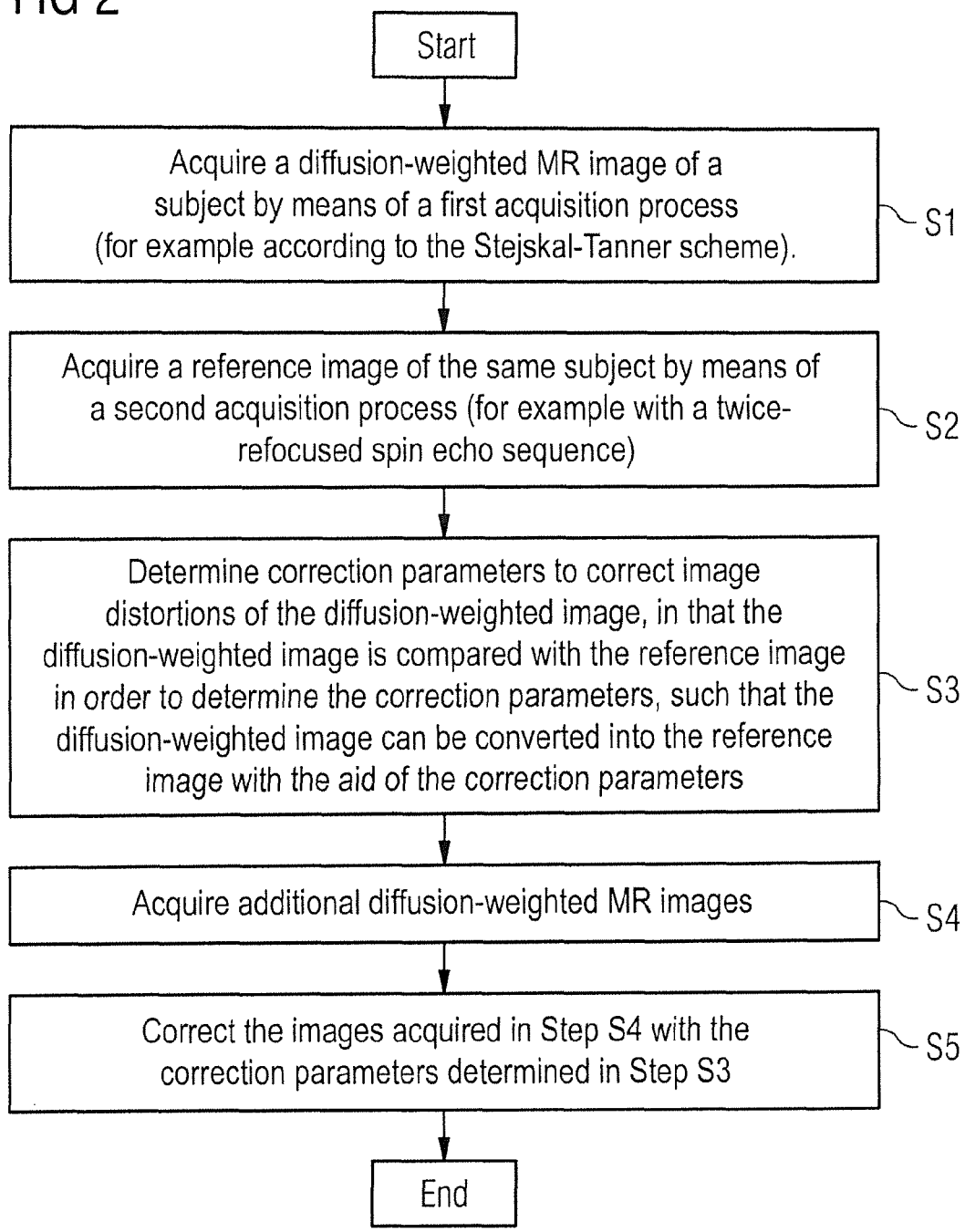
FIG. 2 shows a program workflow of a method according to the invention to generate distortion-free diffusion-weighted MR images.

A flow plan of a method according to the invention to generate diffusion-weighted MR images is shown in FIG. 2. For example, in a first Step S1 diffusion-weighted MR images of the measurement volume 15 (see FIG. 1) are acquired with the Stejskal-Tanner technique.

In the following second Step 2 a reference image of the same measurement volume 15 is acquired with the previously executed twice-refocused spin echo sequence executed in the preceding, for example. Given a corresponding selection of the b-value, in comparison to the diffusion-weighted MR images created in the first Step S1 the reference image is significantly less distorted but has a similar contrast. The significantly less eddy current-dependent distortions in the reference image are to be ascribed to the twice-refocused spin echo sequence which is used only to acquire reference images.

In the following Step S3, correction parameters are determined for the correction of eddy current-dependent image distortions of the diffusion-weighted MR image acquired in Step S1. For this purpose, the diffusion-weighted MR image is compared with the reference image and the correction parameters are determined such that the diffusion-weighted image can be transferred into the reference image by means of the correction parameters. In other words, the correction parameters serve to correct diffusion-weighted MR images with regard to eddy current-dependent image distortions.

Additional diffusion-weighted MR images are acquired in Step S4, wherein eddy current-dependent image distortions in these diffusion-weighted MR images are corrected in Step S5 with the correction parameters determined in Step S3.

While the first embodiment according to the invention that is shown with FIG. 2 is also designated as an adjustment approach, a second embodiment according to the invention exists which is also designated as a "direct approach".

In this second embodiment Steps S1 and S4 of the first embodiment are essentially deconstructed. While (distorted) diffusion-weighted MR images are acquired in S1 in the first embodiment in order to therefore determine the correction parameters in Step S3 (with which correction parameters diagnostic images are then acquired and corrected in Steps S4 and S5), in the second embodiment diagnostic (distorted) images are directly registered to a corresponding reference image. This means that Step S1 is essentially omitted in the second embodiment or, respectively, no dedicated distorted (non-diagnostic) images are acquired in the second embodiment.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method of correcting image distortions that occur in diffusion-weighted magnetic resonance (MR) images of an examination subject, comprising the steps of:
    operating an MR data acquisition unit in order to implement a first diffusion-weighted MR data acquisition procedure, comprising diffusion-weighting that is characterized by a b-value, in order to acquire a diffusion-weighted image of an examination subject, said diffusion-weighted image of said examination subject comprising image distortions that are dependent on eddy currents that arise as a result of implementation of said first diffusion-weighted MR data acquisition procedure, said diffusion-weighted image of the examination subject comprising a diagnostic content exhibiting a contrast;
    operating said MR data acquisition unit in order to implement a second diffusion-weighted data acquisition procedure in order to acquire a diffusion-weighted reference image, said second diffusion-weighted MR data acquisition procedure being different from said first diffusion-weighted MR data acquisition procedure and comprising diffusion-weighting that is characterized by a b-value, said second diffusion-weighted MR data acquisition procedure causing smaller eddy current-dependent distortions in said diffusion-weighted reference image, at a same b-value, then said image distortions in said diffusion-weighted image of said examination subject;
    providing said diffusion-weighted image of said examination subject and said diffusion-weighted reference image into a computerized processor and, in said computerized processor, automatically comparing the diffusion-weighted reference image with the diffusion-weighted image of the examination subject in order to determine contrast-maintaining correction parameters and applying said correction parameters to the diffusion-weighted image of the examination subject in order to correct the distortions in said diffusion-weighted image of the examination subject by converting the diffusion-weighted image of the examination subject into the diffusion-weighted reference image while preserving said diagnostic content of the diffusion-weighted image of the examination subject; and
    making the corrected diffusion-weighted image of the examination subject available in electronic form at an output of the computerized processor.

2. A method as claimed in claim 1 comprising operating said MR data acquisition unit in order to implement said second diffusion-weighted MR data acquisition procedure as a twice-refocused spin echo sequence comprising activating a first bipolar field gradient having a first time period and a second time period, subsequently activating a second bipolar field gradient having a third time period and a fourth time period, shifting a first refocusing RF pulse between said first time period and said second time period, and shifting a second refocusing RF pulse between the third time period and the fourth time period.

3. A method as claimed in claim 1 comprising operating said MR data acquisition unit in order to implement said first diffusion-weighted MR data acquisition procedure with monopolar diffusion coding.

4. A method as claimed in claim 1 comprising operating said MR data acquisition unit in order to implement said first diffusion-weighted MR data acquisition procedure with the Stejskal-Tanner technique.

5. A method as claimed in claim 1 comprising selecting the b-value of said second diffusion-weighted MR data acquisition procedure to be not less than half of the b-value used in said first diffusion-weighted MR data acquisition procedure, and selecting the b-value of said second diffusion-weighted MR data acquisition procedure to be less than 500 s/mm$^2$.

6. A method as claimed in claim 1 comprising acquiring the diffusion-weighted reference image multiple times, and accumulating data representing the multiply acquired diffusion-weighted reference images in order to improve a signal-to-noise ratio of the diffusion-weighted reference image.

7. A method as claimed in claim 6 comprising multiply acquiring the diffusion-weighted reference image with identical diffusion weighting, while varying a diffusion direction; from diffusion-weighted reference image acquisition-to-diffusion-weighted reference image acquisition, in order to acquire a more isotropic diffusion-weighted reference image.

8. A method as claimed in claim 1 comprising:
    acquiring multiple diffusion-weighted images of the examination subject respectively with different b-values in said first diffusion-weighted MR data acquisition procedure;
    acquiring multiple diffusion-weighted reference images respectively with different b-values in said second diffusion-weighted MR data acquisition procedure; and
    selecting the b-value for a respective diffusion-weighted reference image dependent on the b-value of a respective diffusion-weighted image of the examination subject in order to cause a contrast of the respective diffusion-weighted reference image to correspond to a contrast of the respective diffusion-weighted image of the examination subject.

9. A method as claimed in claim 1 comprising acquiring multiple diffusion-weighted images of the examination subject, using different diffusion weightings for different diffusion directions, and determining said correction parameters using a same reference image for each of said multiple diffusion-weighted images of the examination subject.

10. A method as claimed in claim 1 comprising acquiring the diffusion-weighted reference image with different diffusion weightings in different diffusion directions and selecting each diffusion direction along a gradient axis in which eddy current fields occur to a lesser degree than along other gradient axes.

11. A method as claimed in claim 1 comprising acquiring said diffusion-weighted reference image with a diffusion weighting in one diffusion direction, and using multiple gradient axes simultaneously with the diffusion weighting in order to produce a gradient moment necessary for the diffusion weighting in an optimally short time.

12. A method as claimed in claim 1 comprising acquiring said diffusion-weighted reference image in a diagnostic procedure in which diffusion-weighted diagnostic images, which are used for analysis of diffusion behavior in a predetermined volume of the examination subject, are acquired.

13. A magnetic resonance apparatus configured for correcting image distortions that occur in diffusion-weighted magnetic resonance (MR) images of an examination subject, comprising the steps of:
   an MR data acquisition unit;
   a control unit configured to operate said MR data acquisition unit in order to implement a first diffusion-weighted MR data acquisition procedure, comprising diffusion-weighting that is characterized by a b-value, in order to acquire a diffusion-weighted image of an examination subject, said diffusion-weighted image of said examination subject comprising image distortions that are dependent on eddy currents that arise as a result of implementation of said first diffusion-weighted MR data acquisition procedure, said diffusion-weighted image of the examination subject comprising a diagnostic content exhibiting a contrast;
   said control unit being configured to operate said MR data acquisition unit in order to implement a second diffusion-weighted data acquisition procedure in order to acquire a diffusion-weighted reference image, said second diffusion-weighted MR data acquisition procedure being different from said first diffusion-weighted MR data acquisition procedure and comprising diffusion-weighting that is characterized by a b-value, said second diffusion-weighted MR data acquisition procedure causing smaller eddy current-dependent distortions in said diffusion-weighted reference image, at a same b-value, then said image distortions in said diffusion-weighted image of said examination subject; and
   a processor provided with said diffusion-weighted image of said examination subject and said diffusion-weighted reference image, said processor being configured to automatically compare the diffusion-weighted reference image with the diffusion-weighted image of the examination subject in order to determine contrast-maintaining correction parameters, and applying said correction parameters to the diffusion-weighted image of the subject in order to correct the distortions in said diffusion-weighted image of the examination subject by converting the diffusion-weighted image of the examination subject to the diffusion-weighted reference image while preserving said diagnostic content of the diffusion-weighted image of the examination subject, and said processor being configured to make the corrected diffusion-weighted image of the examination subject available in electronic form at an output of the processor.

14. A non-transitory computer-readable storage medium encoded with programming instructions, said storage medium being loaded into a computerized control and processing system of a magnetic resonance (MR) apparatus, and said programming instructions causing said computerized control and processing system to:
   operate an MR data acquisition unit of said MR apparatus in order to implement a first diffusion-weighted MR data acquisition procedure, comprising diffusion-weighting that is characterized by a b-value, in order to acquire a diffusion-weighted image of an examination subject, said diffusion-weighted image of said examination subject comprising image distortions that are dependent on eddy currents that arise as a result of implementation of said first diffusion-weighted MR data acquisition procedure, said diffusion-weighted image of the examination subject comprising a diagnostic content exhibiting a contrast;
   operate said MR data acquisition unit in order to implement a second diffusion-weighted data acquisition procedure in order to acquire a diffusion-weighted reference image, said second diffusion-weighted MR data acquisition procedure being different from said first diffusion-weighted MR data acquisition procedure and comprising diffusion-weighting that is characterized by a b-value, said second diffusion-weighted MR data acquisition procedure causing smaller eddy current-dependent distortions in said diffusion-weighted reference image at a same b-value, then said image distortions in said diffusion-weighted image of said examination subject; and
   compare the diffusion-weighted reference image with the diffusion-weighted image of the examination subject in order to determine contrast-maintaining correction parameters correct the distortions in said diffusion-weighted image of the examination subject by converting the diffusion-weighted image of the examination subject to the diffusion-weighted reference image, while preserving said diagnostic content of the diffusion-weighted image of the examination subject and make the correction diffusion-weighted image of the examination subject available in electronic form at an output of the computerized control and processing system.

* * * * *